United States Patent
Fischer et al.

(10) Patent No.: US 6,903,423 B2
(45) Date of Patent: Jun. 7, 2005

(54) INTEGRATED SEMICONDUCTOR MEMORY AND METHOD FOR REDUCING LEAKAGE CURRENTS IN AN INTEGRATED SEMICONDUCTOR

(75) Inventors: Helmut Fischer, Oberhaching (DE); Jens Egerer, München (DE)

(73) Assignee: Infineon Technologies, AG (DE)

( * ) Notice: Subject to any disclaimer, the term of this patent is extended or adjusted under 35 U.S.C. 154(b) by 0 days.

(21) Appl. No.: 10/843,318

(22) Filed: May 12, 2004

(65) Prior Publication Data

US 2004/0238899 A1 Dec. 2, 2004

(30) Foreign Application Priority Data

May 30, 2003 (DE) .......................... 103 24 611

(51) Int. Cl.[7] .................. H01L 29/76; H01L 29/94; H01L 31/062; H01L 31/113; H01L 31/119
(52) U.S. Cl. .................. 257/368; 257/401; 365/54; 365/182
(58) Field of Search ................. 257/368, 401; 365/54, 182

(56) References Cited

U.S. PATENT DOCUMENTS

| 5,724,297 A | 3/1998 | Noda et al. |
| 6,442,095 B1 | 8/2002 | Ooishi |
| 2002/0145412 A1 * | 10/2002 | Kato .......................... 323/316 |
| 2002/0186581 A1 * | 12/2002 | Yamaoka et al. ........... 365/154 |
| 2003/0160715 A1 * | 8/2003 | Maeda et al. ............... 341/144 |

OTHER PUBLICATIONS

Oliver Weinfurtner, et al., Advanced Controlling Scheme for a DRAM Voltage Generator System, IEEE Journal of Solid–State Circuits, vol. 35, No. 4, Apr. 4, 2000, pp. 552–563.

* cited by examiner

Primary Examiner—Ngân V. Ngô
(74) Attorney, Agent, or Firm—Edell, Shapiro & Finnan, LLC

(57) ABSTRACT

An integrated semiconductor memory can include a plurality of subcircuit blocks arranged on nonoverlapping area sections. The subcircuit blocks each have a block supply line and a block ground line, which supply individual switching elements of the subcircuit blocks with a voltage. Each block supply line and block ground line is connected to a chip supply line and a chip ground line, which run outside the area sections of the subcircuit blocks. At least one connection between the chip supply line and the block supply line of at least one subcircuit block or between the chip ground line and the block ground line of at least one subcircuit block can be isolated by a switching device. Furthermore, a method for reducing leakage currents in a semiconductor memory, which, depending on the operating state of the semiconductor memory, isolates or connects individual subcircuit blocks of the semiconductor memory from or to a voltage supply.

10 Claims, 2 Drawing Sheets

INTEGRATED SEMICONDUCTOR MEMORY AND METHOD FOR REDUCING LEAKAGE CURRENTS IN AN INTEGRATED SEMICONDUCTOR

CROSS REFERENCE TO RELATED APPLICATIONS

This application claims priority under 35 USC §119(e) to German Application No. 10324611.8, filed on May 30, 2003, and titled "Integrated Semiconductor Memory And Method For Reducing Leakage Currents In An Integrated Semiconductor Memory," the entire contents of which are hereby incorporated by reference.

FIELD OF THE INVENTION

This invention relates to an integrated semiconductor memory and method for reducing leakage currents in an integrated semiconductor memory.

BACKGROUND

During regular operation in a memory module, there are a plurality of subcircuit blocks which are actually not utilized. These subcircuit blocks are usually arranged in a specific region of the memory module and characterized by a functional effect.

Thus, the fact of which functional subcircuit blocks are active at a given point in time in a memory module is generally dependent on external commands. For example, the circuits for tests of the memory cell array are only active in a test mode, and not during regular operation.

Moreover, in a memory module of a modern generation, the individual subcircuit blocks usually wait for a new command. Thus, in the "precharge power down" phase of a semiconductor memory module, in which the semiconductor memory waits for a read or write command, the functional subcircuit blocks for the row or column decoding and also the functional block for the data path are deactivated.

Despite their logical deactivation, the inactive subcircuit blocks of a semiconductor memory consume a small current, which is called a leakage current and is usually of the order of magnitude of a few $\mu A$. In a standby operation, in which only few circuit parts are actively operated, the leakage current proportion rises rapidly in comparison with the switching current proportion.

The cause of such leakage currents has both technological reasons, for example, contaminants in the semiconductor material, and physical reasons, for example, thermal generation of the charge carriers. At feature sizes of <100 nm, the leakage current is expected to rise rapidly on account of these effects. At these small feature sizes, quantum mechanical effects such as tunneling currents, for example, additionally arise and increase the leakage current further.

SUMMARY

In one general aspect, an integrated semiconductor memory on a semiconductor chip, including at least two subcircuit blocks having switching elements. Each of the subcircuit blocks can have a functional effect in an operation of the semiconductor memory and the subcircuit blocks can be arranged on mutually nonoverlapping area sections of the semiconductor chip. Each section including a respective block supply line and a respective block ground line, which can be arranged within the area section of each of the at least two subcircuit blocks and are connected to switching elements for supply with a supply voltage, further including a chip supply line, which can be arranged in an area section of the semiconductor chip outside the area sections of the at least two subcircuit blocks and is connected to at least one first contact point of the semiconductor chip, the contact point being formed for linking to an external supply line, including a respective connecting element connected between the chip supply line and each of the block supply lines, and furthermore including a chip ground line, which is arranged in an area section of the semiconductor chip outside the area sections of the at least two subcircuit blocks and is connected to at least one second contact point. The contact point can be formed for linking to an external ground line, and can include a respective connecting element connected between the chip ground line and each of the block ground lines.

In another aspect, a method for reducing leakage currents in an integrated semiconductor memory including at least two subcircuit blocks and also a voltage supply. The subcircuit blocks (SB1, SB2) can have a functional effect and the integrated semiconductor memory can be in one of a plurality of operating states.

A semiconductor memory arrangement that can be used to reduce the leakage current, and a method, which can reduce the leakage current, are desirable.

In a semiconductor on a chip, at least one connecting element between the chip supply line and a block supply line of at least one subcircuit block or between the chip ground line and a block ground line of at least one subcircuit block, can be provided. The connecting element can be formed in switchable fashion as a switching device or can have a switching device.

As a result, each functional subcircuit block within a semiconductor memory can be isolated from the chip supply voltage. A subcircuit block isolated in this way may not contribute to the total leakage current of the circuit. If the subcircuit block is required, then it can be connected to the chip supply line again via the switching device.

A method for reducing leakage currents in a semiconductor memory can include at least one of the subcircuit blocks can be isolated from the voltage supply of the integrated semiconductor memory, if the functional effect of the at least one subcircuit block is not necessary for the operating state that the integrated semiconductor memory is in, and a subcircuit block isolated from the voltage supply of the integrated semiconductor memory is connected to the voltage supply, if the functional effect of the isolated subcircuit block is necessary for the operating state that the integrated semiconductor memory is in.

This can reduce the total leakage current of the semiconductor memory by the contribution of the disconnected subcircuit block.

For example, contact points can be formed as bonding pads on the surface of the semiconductor memory. These may be connected to a line, which is situated outside the chip and to which a potential is applied. The semiconductor memory can be supplied with an operating voltage.

The switching device can be connected to a transformation apparatus, which can convert a chip supply voltage of the semiconductor memory to a block supply voltage of at least one subcircuit block. Different supply voltages can be required for subcircuit blocks of the integrated semiconductor memory. Thus, the semiconductor memory can be supplied with a chip supply voltage and the individual subcircuit blocks can be supplied with a block supply voltage provided by the transformation apparatus. The latter can be, in turn, supplied by the chip supply voltage.

Consequently, this transformation apparatus can convert the chip supply voltage into a block supply voltage depending on the requirement of the functional subcircuit block. The transformation apparatus can be isolated from the chip supply voltage by the switching device.

If the semiconductor memory has an arrangement connected to signal outputs of a disconnectable functional subcircuit block, this arrangement can hold the signal outputs of the functional subcircuit block in a defined state during a state of isolation of the block supply or block ground line of the subcircuit block from the chip supply or chip ground line. Error functions, which can occur due to an undefined state of the outputs of the disconnected subcircuit block, can be avoided.

In this connection, the arrangement can be connected to the chip supply line and the chip ground line.

A subcircuit block has a plurality of operating states and can be connected to a memory device in which is stored the operating state of the subcircuit block before an isolation from the supply voltage, so that the operating state of the subcircuit block can be re-established after a renewed connection to the voltage supply. Consequently, internal parameters and settings of the subcircuit block can be stored in a memory device before an isolation and be re-established after a renewed connection. The respective last state of the subcircuit block can be preserved, and a malfunction after an activation of the subcircuit block can be avoided.

The memory device can be formed as a memory register.

At least one functional subcircuit block can be formed as a test subcircuit block for testing the subcircuit blocks of the semiconductor memory for correct functioning. This subcircuit block can be activated during the test cycle of the semiconductor memory and otherwise can remain in a deactivated state isolated from the chip supply line or the chip ground line.

A device which, depending on an operating state of the integrated semiconductor memory, can carry out an activation of deactivation of subcircuit blocks that can be isolated from the supply voltage, can be connected to the switching device. The activation or deactivation can be effected by control of the switching device by the device.

The operating state of the semiconductor memory can be prescribed by a command sent to the device and the device can be formed as a command decoder for decoding the command sent. The operating state of the integrated semiconductor memory usually depends on external commands. Consequently, a command decoder which processes external commands can make a decision, in a simple manner, with regard to unrequired subcircuits of the integrated semiconductor memory in a specific operating mode.

A control device can be connected to the switching device. The control device can enable temporal and logical control of the switching process, so that, for an operating state of the integrated semiconductor memory, the subcircuit blocks can be in a defined and active or functional operating state. Thus, by the control device, functional subcircuit blocks of the semiconductor memory can be activated or deactivated as required to reduce the leakage current. The current requirement can thus be reduced overall.

In the event of a change in the operating state of the integrated semiconductor memory into a new operating state, depending on the type of change, subcircuit blocks, which may or may not be necessary for the new operating state can be connected to or isolated from the voltage supply of the integrated semiconductor memory (HS) before the operating state of the integrated semiconductor memory (HS) changes.

This permits, as required, subcircuit blocks of the integrated semiconductor memory that are not required for an operating state to be disconnected and the leakage current to be reduced. At the same time, a functional state of the semiconductor memory can be preserved.

The operating state of the integrated semiconductor memory can be changed by a command that has been sent to the semiconductor memory.

An operating mode of the integrated semiconductor memory can be a test mode in which at least one subcircuit block for testing the semiconductor memory (HS) for correct functioning can be connected to the voltage supply of the integrated semiconductor memory.

The last operating state of a subcircuit block, which can have a plurality of operating states before isolation from the supply voltage and re-establishment of the operating state after a renewed connection, can be stored. Malfunctions can thus be avoided.

BRIEF DESCRIPTION OF THE FIGURES

The invention is explained in detail below using exemplary embodiments with reference to the figures, in which.

DETAILED DESCRIPTION

Figure 1:
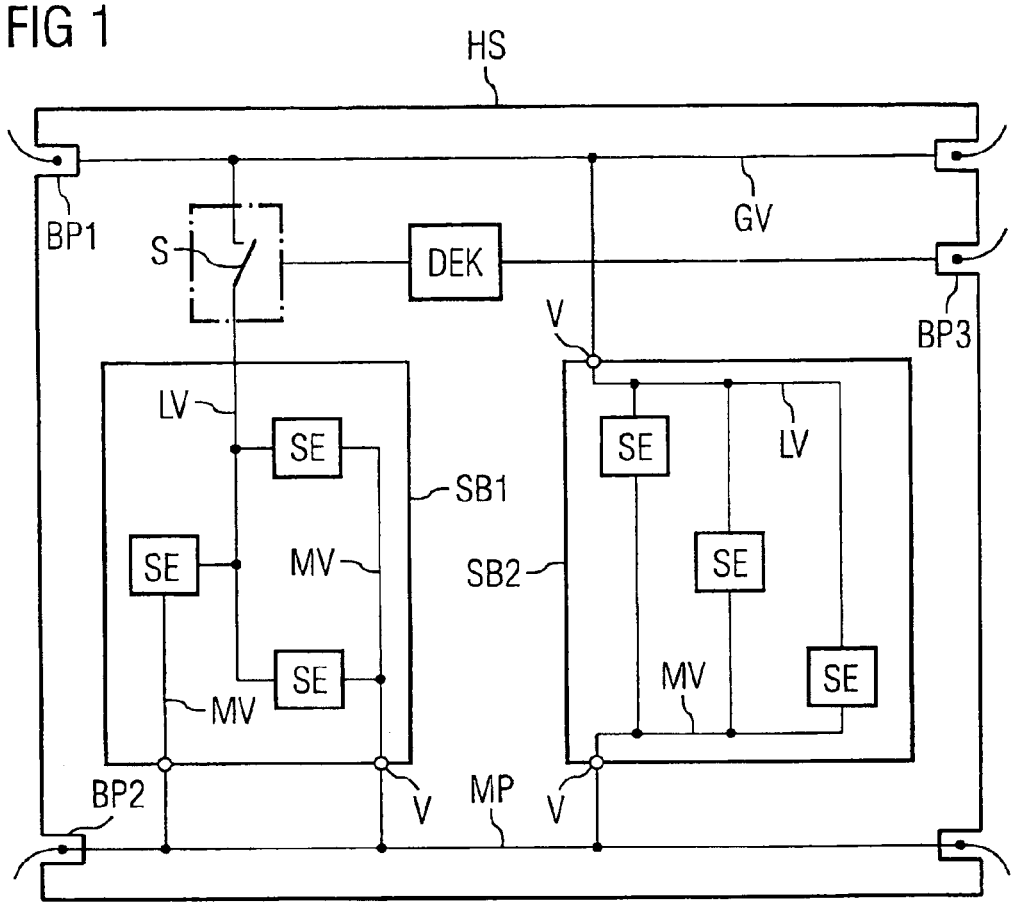
FIG. 1 shows an exemplary embodiment of the arrangement.

FIG. 1 shows a semiconductor memory HS on a chip made with a semiconductor material with two subcircuit blocks SB1 and SB2 illustrated here. The two subcircuit blocks can have a functional effect within the semiconductor memory and can be accommodated spatially separately on the chip in two subregions. Furthermore, they can be connected to further functional subcircuit blocks (not shown) and also to one another.

The functional subcircuit blocks SB1 and SB2 can have individual switching elements SE assigned to the subcircuit blocks, in each case, three of the switching elements being shown here. The switching elements can be connected to one another and accommodated in the area section of the subcircuit block with which they can be associated. The interaction of all these switching elements SE can produce the functional mode of action of the subcircuit block. To put it another way, the area of the switching elements, which can be connected to one another in order to achieve a functional effect, can form the area of the subcircuit block.

The switching elements shown here can be connected to a block supply line LV and to a block ground line MV. The two lines can run within the subcircuit block SB1 and SB2, respectively, and can be part of the block. The block lines of different functional subcircuit blocks can be spatially separate.

Of course, the subcircuit blocks SB1, SB2 can also be connected to one another via signal lines that are not shown for the sake of clarity, the functional effect used here being defined such that the elements SE of the subcircuit block have to be activated or are operated jointly in order to fulfill the function of the subcircuit block. If individual elements can be deactivated, i.e., disconnected or isolated from a current supply, then they may not belong to a subcircuit block if the latter fulfills its function even without the disconnected elements. Thus, switching elements which can be used for testing bit or word lines may not belong to the subcircuit block bit or word line, if they are used only during a test mode of the semiconductor memory.

Furthermore, the switching elements of the bit or word line form the likewise dedicated functional subcircuit blocks of a bit line block or word line block since they are not required in some operating modes, for example, when testing a command decoder of the semiconductor memory or the "precharge power down" phase. Consequently, switching elements SE can be combined and form subcircuit blocks SB1, SB2 which are characterized by their functional effect.

Therefore, one functional subcircuit block can, for example, a test circuit block for testing other subcircuit blocks of the integrated semiconductor memory for correct functioning. A respective further functional subcircuit block is the driving of the bit or word line, that is to say the bit or word decoding for the individual memory cells. The data path can form yet another functional subcircuit block.

An operating state of the semiconductor memory HS can have a functional effect, which can be produced as the sum of the functional effects of the subcircuit blocks that may be necessary for this operating state. To put it another way, the functional effects of the subcircuit blocks bit line or word line may not be required in a test operating state of the semiconductor memory in which the command decoder is tested.

The semiconductor memory HS can have a chip ground line MP and a chip supply line GV, which are not part of an individual functional subcircuit block, on its chip. The two lines GV and MP can be connected to contact points BP1 and BP2, respectively. The contact points BP1 and BP2 can be formed as bonding pads on the surface of the chip. Lines, which apply a supply potential to the chip on the chip supply line GV and a ground potential to the chip on the chip ground line MP can be bonded to the pads. Therefore, these connections can carry the voltage supply for the entire chip during operation.

The chip ground line MP can have a connecting element V to the block ground line MV of each subcircuit block SB1 and SB2, respectively. Thus, each block ground line can be connected to the chip ground line in this example.

The block supply line LV of the functional subcircuit block SB2 can be directly connected to the chip supply line GV via the connecting element V. The block supply line LV of the subcircuit block SB1 can be connected to the chip supply line GV via the connecting element V containing a switch S.

The connecting element V coupled to the block supply line LV of the subcircuit block SB1 can be connected to a decoding device DEK, which, for its part, can have a connection to a contact point BP3. The contact point BP3 can be formed as a bonding pad.

With switch S closed, the chip supply line GV and chip ground line MP can supply the two subcircuit blocks SB1 and SB2 with a voltage via the respective block supply and block ground lines. Consequently, the chip supply line GV and chip ground line MP can supply the functional subcircuit blocks SB1, SB2, while the block supply and block ground lines LV, MV can supply the switching elements SE of the respective functional subcircuit block SB1 or SB2.

In order to open the switch S, a command signal for isolating the subcircuit block SB1 from the supply voltage can be sent to the decoding device DEK via the bonding pad BP3. The decoding device can receive the signal, can evaluate it and can open the switch S of the connecting element V.

If the switch S is open, the functional block SB1 can be isolated from the chip supply line and thus from its voltage supply. The switching elements SE contained therein are isolated from the voltage supply. Consequently, said functional block no longer generates a leakage current. The switch S is opened whenever the circuit block SB1 is not required for operation of the semiconductor memory.

Figure 2:
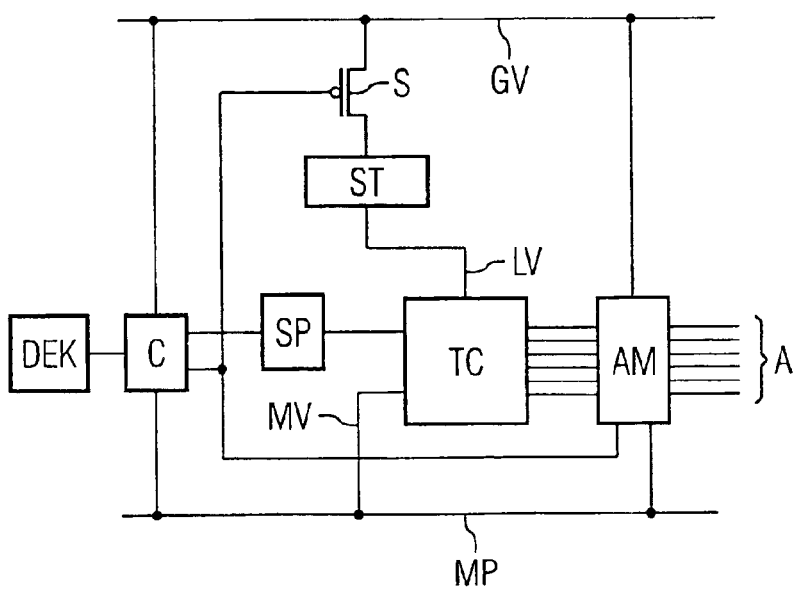
FIG. 2 shows a development of the arrangement.

FIG. 2 shows a detail from a functional subcircuit block of the semiconductor memory HS. Similar elements bear the same reference symbols.

A chip supply voltage can be applied to a chip supply line GV. The chip supply line GV can be connected to the switch S, which can be formed as a MOS transistor. The drain contact of the MOS transistor S can lead to a transformation apparatus ST. The transformation apparatus ST can be part of the functional subcircuit block and can convert the chip supply voltage on the line GV into the block supply voltage on the block supply line LV that is required by the elements of the subcircuit block.

The block supply line LV can be connected to the circuit logic TC. The circuit logic TC can be a test circuit for testing different further functional subcircuit blocks of the semiconductor memory and, for its part, can include individual switching elements (not shown). The circuit logic TC can be connected to the block ground line MV, which can again be connected to the chip ground line MP.

The circuit logic TC can have a plurality of signal outputs connected to a switching matrix AM. The switching matrix AM may not be part of the functional subcircuit block since the matrix, for supply, can be connected directly to the chip supply line GV and the chip ground line MP. The outputs A of the switching matrix AM lead to further functional subcircuit blocks (not shown here) of the semiconductor memory.

The semiconductor memory can have a controller C. For supply, the controller C can be directly connected to the chip supply and chip ground line. Furthermore, it can be connected to the gate contact of the switching transistor S for control of the switching process of the switching matrix AM. The controller can be connected to a command decoder DEK and to a memory device SP. For its part, the memory device SP can be connected to the subcircuit block TC such that it can store internal parameters of the subcircuit block TC, which maybe necessary for an operating state in a memory and can transfer them as required back into the subcircuit block. For this purpose, it can read the internal operating parameters and transfer them again (not shown).

The memory of the device SP can be formed as a simple register. For its part, the memory device SP cannot be disconnected, but rather can be connected to the chip supply voltage in operating states of the semiconductor memory HS. However, a nonvolatile memory may also be conceivable as part of the memory device SP.

In a test operating mode, the supply voltage can result as a difference between the chip supply potential on the chip supply line GV and the chip ground line MP. In this operating mode, with switch S closed, this supply voltage can be converted into a block supply voltage by the transformation apparatus ST and can be fed to the subcircuit block TC. In a test operating mode, the subcircuit block TC can be required and can generate test signals, which can be present at its signal outputs. The test signals can be received via the switching matrix AM by the subcircuit blocks—connected to the outputs of the matrix AM of the semiconductor memory HS and can be evaluated. As a result, individual blocks can be tested for correct functioning.

If the command decoder DEK receives a command for a change into another operating state, in which the subcircuit block TC may not be necessary, this can lead to a disconnection of the subcircuit block TC. For this purpose, after an evaluation of the command, the command decoder DEK can send a command to the control device C. The latter can activate the memory device SP, which can read the internal parameters of the block TC and can store them in its register. Afterward, the control device C can switch the signal outputs of the circuit logic TC to defined states by the switching matrix AM. As a result, a malfunction may not occur in the subcircuit blocks connected to the signal outputs. Finally, it can open the switch S by putting the gate of the transistor at a potential which causes the transistor to undergo transition to a nonconducting state.

The circuit logic TC may now be separated not only logically from the remaining subcircuit blocks of the semiconductor memory, but also physically from the current supply of the semiconductor memory and, consequently, no longer generates a leakage current.

If the subcircuit block or the circuit logic TC is required again as a result of a further change in the operating state of the semiconductor memory, then a signal for activation can be sent from the command decoder DEK to the control device C. The latter can close the switch S by pulling the gate of the MOS transistor to a potential, which can turn the transistor on. As a result, a local supply current in the block supply line LV can again be present at the circuit logic TC. Afterward, the parameters in the register of the memory device SP can again be loaded into the subcircuit block TC. In a final step, the control device C can switch the outputs A of the switching matrix AM back to the outputs of the switching block TC.

In this connection, the MOS transistor S can fit between transformation apparatus ST and subcircuit block TC, rather than between chip supply line GV and transformation apparatus ST. The transformation apparatus may then not be part of the functional subcircuit block. As an alternative, the switch S may also fit between the block ground line MV and the chip ground line MP. Overall, a functional subcircuit block can thereby be isolated from the chip supply voltage by means of the switch S.

Since, in a modern semiconductor memory, the operating state is usually dependent on external commands, the command decoder DEK, which is shown in FIG. 2 decodes and correspondingly forwards external commands can be used to activate or deactivate individual functional subcircuit blocks as required. For this purpose, it can be coupled to the switchable connecting elements V, which connect the respective block supply or block ground lines to the chip supply or chip ground line.

The command decoder can receive the command for a change in the operating state and can analyze the command. After the analysis, it decides the extent to which subcircuits that may no longer be required can be disconnected in order to reduce the current consumption. The signal for disconnection can then be sent to the subcircuits.

The controller C that receives this signal can provide enough time for error-free activation, or to deactivate the subcircuit block in a suitable manner. Thus, it may also have a memory, in the simplest case, i.e., a register, in which the subcircuit block to be disconnected can store its operating parameters for the last state before the disconnection. The controller can read out the operating state of the subcircuit block, stores the values, and then can isolate the subcircuit block from the voltage supply.

If the subcircuit block is required again, the controller C can connect it to the voltage supply and can reset the block to the operating state that the subcircuit block was in before the isolation. Then does the controller can enable the subcircuit block, so that it can begin functioning.

The switching matrix AM can generally be formed as gates, and in a simple case, i.e., can be formed by NAND or NOR gates. The switching matrix AM can be connected to the block supply line rather than to the chip supply line. However, the switching matrix may not be switched off in order that an undefined state of the outputs of the switching block TC may not be present.

A metal can be used as supply or ground lines. The same or different materials, such as copper, aluminum, gold or other compounds for block lines, and chip lines, can be used. The transition according to the invention between a chip supply or chip ground line and a block supply or block ground line can be provided at that location on the chip at which a switch could be inserted in order to isolate individual elements which are functionally related to one another from a supply voltage. The individual elements, in turn can form the functional subcircuit block.

The switch S can, in this case, be formed as a simple MOS transistor. Bipolar transistors or other types of FETs can be used. The residual leakage current can be produced by the switch S, which can be designed correspondingly in order to generate a very small leakage current.

Figure 3:
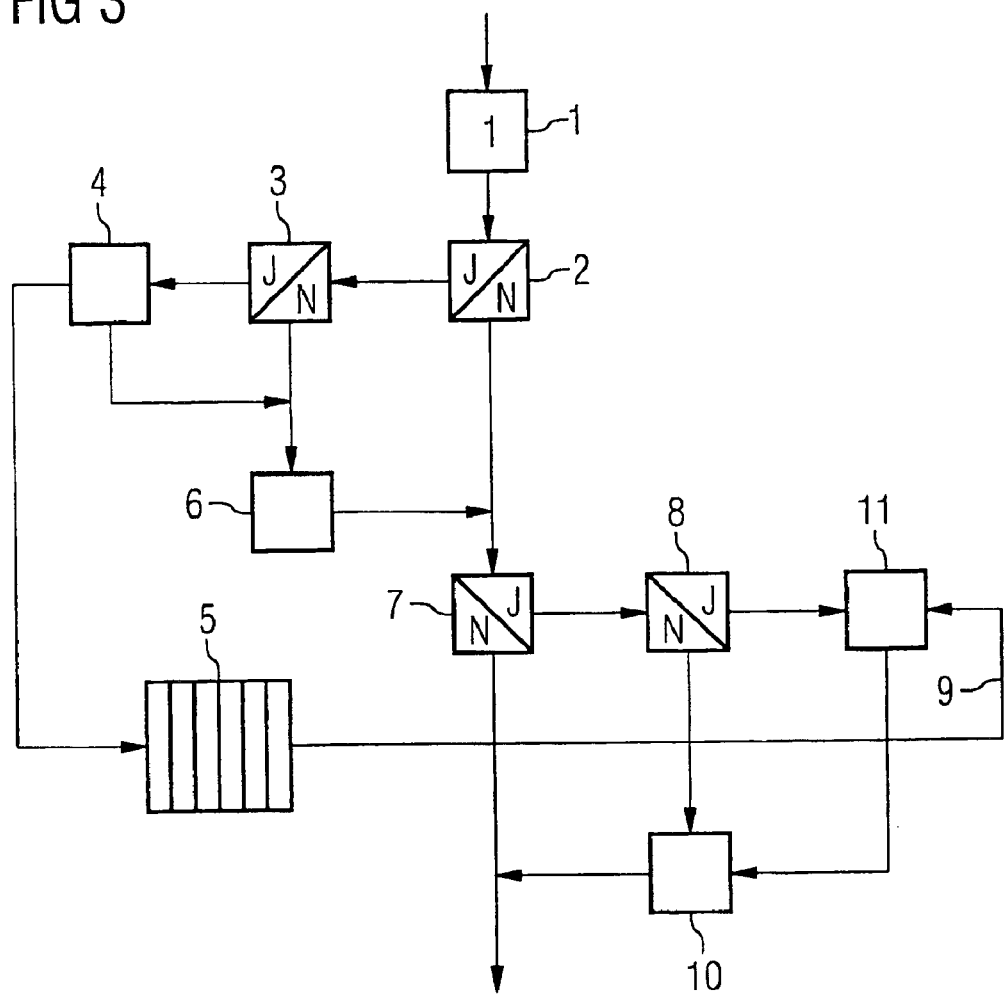
FIG. 3 shows an exemplary embodiment of the method.

FIG. 3 shows an example of a method according to the invention such as may take place in a semiconductor memory of the type described above. A command decoder can receive an external command 1 for changing the operating state of the semiconductor memory. After the decoding, it can analyze whether active subcircuit blocks supplied with current can be present, which may no longer be required for the new operating state.

If this is the case, then a check can be made to determine whether there is a need to save the last state before an isolation. If this is applicable, then the parameters, which can be necessary for this operating state, can be read 4 from the subcircuit block and can be stored 5 in a register. Afterward, the subcircuit block can be deactivated. For this purpose, the outputs of the subcircuit block can be brought to a safe defined state and the subcircuit block can be isolated from the voltage supply.

A check can then be made to determine whether an activation of a hitherto deactivated subcircuit block maybe necessary for the new operating state of the semiconductor memory. If this is applicable, an analysis can be undertaken to determine whether the subcircuit block to be activated requires re-establishment of the last state before its isolation.

If such a result is negative, then the deactivated subcircuit block can be activated being connected to the voltage supply and its outputs can be isolated from the defined state. Otherwise, after a connection to the voltage supply, the last state has to be read 9 from the register and transferred 11 into the subcircuit block. When the state of the subcircuit block is stable, the defined state of the outputs cancelled by the switching matrix can be switched back to the outputs of the subcircuit block.

The method can be repeated for the subcircuit blocks. It can thus be effected sequentially, but also in parallel by the subcircuit blocks being processed simultaneously. This procedure additionally saves a great deal of time. Moreover, it is possible to interchange the order of individual steps, for example, the analysis steps 2 and 7.

The above description of the exemplary embodiments in line with the present invention serves merely for illustrative purposes and not to limit the invention. The invention allows various changes and modifications without departing from the scope of the invention and its equivalents.

LIST OF REFERENCE SYMBOLS (HS): Semiconductor memory
(SB1, SB2): Functional subcircuit blocks
(SE): Switching elements
(LV): Block supply line
(MV): Block ground line
(GV): Chip supply line
(MP): Chip ground line
(V): Connection
(BP): Contact point
(S): Switching device
(ST): Transformation apparatus
(AM): Switching matrix
(C): Controller
(TC): Circuit logic
(DEC): Command decoder
(SP): Memory device
(1 . . . 11): Method steps

We claim:

1. An integrated semiconductor memory on a semiconductor chip, comprising:
    at least two subcircuit blocks with switching elements, each of the subcircuit blocks having a functional effect in an operation of the integrated semiconductor memory, the subcircuit blocks being arranged on mutually nonoverlapping area sections of the semiconductor chip;
    a respective block supply line and a respective block ground line, which are arranged within the area section of each of the at least two subcircuit blocks and are coupled to switching elements for supply with a supply voltage;
    a chip supply line, the chip supply line being arranged in an area section of the semiconductor chip outside the area sections of the at least two subcircuit blocks, the chip supply line being connected to at least one first contact point of the semiconductor chip, the first contact point being formed for linking to an external supply line;
    a respective connecting element connected between the chip supply line and each of the block supply lines of the subcircuit blocks;
    a chip ground line, the chip ground line being arranged in an area section of the semiconductor chip outside the area sections of the at least two subcircuit blocks, the chip ground line being connected to at least one second contact point of the semiconductor chip, the second contact point being formed for linking to an external ground line; and
    a respective connecting element connected between the chip ground line and each of the block ground lines of the subcircuits, at least one of the connecting elements between the chip supply line and the block supply line of at least one subcircuit block or between the chip ground line and the block ground line of at least one subcircuit block being formed in switchable fashion as a switching device,
    wherein a subcircuit block has a plurality of operating states and is connected to a memory device, the memory device being arranged in an area section of the semiconductor chip, the memory device storing the operating state of the subcircuit block before an isolation from the supply voltage so that the operating state of the subcircuit block can be re-established after a renewed connection to the voltage supply.

2. The semiconductor memory as claimed in claim 1, wherein the switching device is connected to a transformation apparatus, the transformation apparatus converting a chip supply voltage of the semiconductor memory to a block supply voltage of at least one subcircuit block.

3. The semiconductor memory as claimed in claim 1, wherein the switching device is formed as a MOS transistor.

4. The semiconductor memory as claimed in claim 1, wherein the contact points are formed as bonding pads on a surface of the semiconductor memory.

5. The semiconductor memory as claimed in claim 1, further comprising:
    an arrangement, the arrangement being connected to outputs of at least one subcircuit block and holding the signal outputs of the subcircuit block in a defined state during the state of isolation of the block supply or block ground line of the subcircuit block from the chip supply or chip ground line.

6. The semiconductor memory as claimed in claim 1, wherein the memory device is formed as a register.

7. The semiconductor memory as claimed in claim 1, wherein at least one subcircuit block is formed as a test subcircuit block for testing the subcircuit blocks of the semiconductor memory for correct functioning.

8. The semiconductor memory as claimed in claim 1, further comprising:
    a device for activation or deactivation depending on an operating state of the integrated semiconductor memory, of subcircuit blocks that can be isolated from the supply voltage, the device being connected to the switching device.

9. The semiconductor memory as claimed in claim 8, wherein the operating state of the semiconductor memory is prescribed by a command sent to the device and the device is formed as a command decoder for decoding the commands sent.

10. The semiconductor memory as claimed in claim 1, wherein a control device is provided, the control device being connected to the switching device, the control device temporally and logically controlling the switching process so that the subcircuit blocks required for an operating state of the integrated semiconductor memory are in a defined and active operating state.

* * * * *